(12) United States Patent
Jung et al.

(10) Patent No.: US 8,406,064 B2
(45) Date of Patent: Mar. 26, 2013

(54) LATCHING CIRCUIT

(75) Inventors: Seong-Ook Jung, Seoul (KR); Kyungho Ryu, Seoul (KR); Jisu Kim, Seoul (KR); Jung Pill Kim, San Diego, CA (US); Seung H. Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 230 days.

(21) Appl. No.: 12/847,371

(22) Filed: Jul. 30, 2010

(65) Prior Publication Data

US 2012/0026783 A1  Feb. 2, 2012

(51) Int. Cl.
*G11C 7/10* (2006.01)

(52) U.S. Cl. .................................. 365/189.05; 365/158

(58) Field of Classification Search ............. 365/189.05, 365/158
See application file for complete search history.

(56) References Cited

U.S. PATENT DOCUMENTS

| | | | |
|---|---|---|---|
| 5,841,719 A * | 11/1998 | Hirata ....................... | 365/189.15 |
| 5,892,712 A | 4/1999 | Hirose et al. | |
| 6,147,922 A | 11/2000 | Hurst, Jr. et al. | |
| 6,317,359 B1 | 11/2001 | Black et al. | |
| 6,343,032 B1 | 1/2002 | Black et al. | |
| 7,663,917 B2 | 2/2010 | Cuppens et al. | |
| 7,898,838 B2 | 3/2011 | Chen et al. | |
| 2004/0066669 A1 | 4/2004 | Ooishi | |
| 2006/0256461 A1 | 11/2006 | Ezaki et al. | |
| 2010/0054020 A1 | 3/2010 | Ueda | |
| 2010/0073991 A1 | 3/2010 | Yamada et al. | |

FOREIGN PATENT DOCUMENTS

| | | |
|---|---|---|
| EP | 1422721 | 5/2004 |
| WO | WO2008112746 A2 | 9/2008 |

OTHER PUBLICATIONS

S. Shingematsu, S. Mutoh, Y. Matsuya, Y. Tanabe and J. Yamada, "A 1-V high-speed MTCMOS circuit scheme for power-down application circuits," IEEE J. Solid- State Circuits, vol. 32, No. 6, pp. 861-869, Jun. 1997.

K-W. Choi, Y. Xu, and T. Sakurai, "Optimal zigzag (OZ): an effective yet feasible power-gating scheme achieving two orders of magnitude lower standby leakage," in Symp. VLSI Circuits Dig. Tech. Papers, Jun. 2005, pp. 312-315.

L. Wei, Z. Chen, K. Roy, M. C. Johnson, Y. Ye, and V. K. De, "Design and optimication of dual-threshold circuits for low-voltage low-power applicaitons," IEEE Trans. Very Large Scale Integr. (VLSI) Syst., vol. 7, No. 1, pp. 16-24, Mar. 1999.

(Continued)

*Primary Examiner* — Son Dinh
*Assistant Examiner* — Nam Nguyen
(74) *Attorney, Agent, or Firm* — Sam Talpalatsky; Nicholas J. Pauley; Johnathan T. Velasco

(57) ABSTRACT

A non-volatile latch circuit includes a pair of cross-coupled inverters, a pair of resistance-based memory elements, and write circuitry configured to write data to the pair of resistance-based memory elements. The pair of resistance-based memory elements is isolated from the pair of cross-coupled inverters during a latching operation. A sensing circuit includes a first current path that includes a first resistance-based memory element and an output of the sensing circuit. The sensing circuit includes a second current path to reduce current flow through the first resistance-based memory element at a first operating point of the sensing circuit. The sensing circuit may also include an n-type metal-oxide-semiconductor (NMOS) transistor to provide a step down supply voltage to the first current path.

20 Claims, 13 Drawing Sheets

OTHER PUBLICATIONS

M. C. Johnson, D. Somesekhar, and K. Roy, "Leakage control with efficient use if transistor stacks in single threshold CMOS," IEEE Trans. Very Large Scale Integr. (VLSI) Syst., vol. 10, No. 1, pp. 442-445, Feb. 2002.

T. Hiramoto, M. Takamiya, H. Koura, T. Inukai, H. Gomyo, H. Kawaguchi and T. Sakurai, "Optimum device parameters and scalability of variable threshold voltage complementary MOS (VTCMOS)," Jpn. J. Appl. Phys., vol. 40, No. 4B, pp. 2854-2858, Apr. 2001.

B. H. Calhoun and A. P. Chandrakasan, "Standby Power Reduction Using Dynamic Voltage Scaling and Canary Flip-Flop Structures," IEEE J. Solid- State Circuits , vol. 39, No. 9, pp. 1504-1511, Sep. 2004.

Noboru Sakimura, Tadahiko Sugibayashi, Ryusuke Nebashi, and Naoki Kasai, "Nonvolatile magnetic flip-flop for standby-power-free SoCs," IEEE J. Solid- State Circuits, vol. 44, No. 8, pp. 2244-2250, Aug. 2009.

M. Durlam, P. J. Naji, A. Omair, M. DeHerrera, J. Calder, J. M. Slaughter, B. N. Engel, N. D. Rizzo, G. Grynkewich, B, Butcher, C. Tracy, K. Smith, K. W. Kyler, J. J. Ren, J. A. Molla, W. A. Feil, R. G. Williams, and S. Tehrani, "A 1-Mbit MRAM based on 1T1MTJ bit cell integrated with copper interconnects," IEEE J. Solid- State Circuits. vol. 38, No. 5, pp. 769-773, May 2003.

M. Hosomi, H. Yamagishi, T. Yamomoto, K. Bessho, Y. Higo, K. Yamane, H. Yamada, M. Shoji, H. Hachino, C. Fukumoto, H. Nagao, and H. Kano, "A novel nonvolatile memory with spin torque transfer magnetization switching: Spin-RAM," in Int. Electron Devices Meeting (IEDM) Tech. Dig., 2005, pp. 459-462.

U.K. Klostermann, M. Angerbauer, U. Gruning, F. Kreupl, M. Ruhriug, F. Dahmani, M. Kund and G. Muller, "A Perpendicular Spin Torque Switching based MRAM for the 28 nm Technology Node," in Int. Electron Devices Meeting (IEDM) Tech. Dig., 2007, pp. 187-190.

W. C. Black, Jr., and Bodhisativa Das, "Programmable logic using giant-magnetoresistance and spin-dependnent tunneling devices," J. appl. Phys., vol. 87, No. 9, pp. 6674-6679, May 1, 2000.

Y. Guillement, L. Torres, G. Sassatelli, N. Bruchon and I. Hassoune, "A non-volatile run-time FPGA using thermally assisted switching MRAMs," Int. Conf. on Field Programmable Logic and Applicaitons, 2008 , pp. 421-428.

W. Zhao, E. Belhaire, C. Chappert, F. Jacquet, and P. Mazoyer, "New non-volatile logic based on spin-MTJ," Phys. Stat. Sol. (a) 205, No. 6, pp. 1373-1377, May 19, 2008.

W. Zhao, E. Belhaire, C. Chappert, and P. Mazoyer, "Power and area optimization for run-time reconfiguration System on Programmable Chip based on Magnetic Random Access Memory," IEEE Trans. Magn., vol. 45, No. 2, pp. 776-780, Feb. 2009.

W. Zhao, C. Chappert, V. Javerliac, and J-P Nozière, "High Speed, high stability abd low power sensing amplifier for MTJ/CMOS hybrid logic circuits," IEEE Trans. Magn., vol. 45, No. 10, pp. 3784-3787, Oct. 2009.

S. Ikeda, J. Hayakawa, Y. M. Lee, F. Matsukura, Y. Ohno, T. Hanyu, and Hideo Ohno, "Magnetic tunnel junctions for spintronic memories and beyond," IEEE Trans. Electron Devices, vol. 54, No. 5, pp. 991-1002, May 2007.

W. Xu, T. Zhang, and Y. Chen, "Design of spin-torque transfer magnetoresistive RAM and CAM/TCAM with high sensing and search speed," IEEE Trans. Very Large Scale Integr. (VLSI) Syst., vol. 18 No. 1, pp. 66-74, Jan. 2010.

K. Fukuoka, O. Ozawa, R. Mori, Y. Igarashi, T. Sasaki, T. Kuraishi, Y. Yasu, and Ishibashi, "A 1.92µs-wake-up time thick-gate-oxide power switch technique for ultra low-power single-chip mobile processors," in Symp. VLSI Circuits Digest of Technical Papers, Jun. 2007, pp. 128-129.

P. Royannez, H. Mair, F. Dahan, M. Wagner, M. Streeter, L. Bouetel, J. Blasquez, H. Clasen, G. Semino, J. Dong, D. Scott, B. Pitts, C. Raibaut, and U. Ko, "90nm low leakage SoC design techniques for wireless applicaitons," in Proc. IEEE Solid-State Circuits Conf., 2005, pp. 138-139, 589.

S. Shigematsu, S. Mutoh, Y. Matsuya, and J. Yamada, "A 1-V high-speed MTCMOS circuit scheme for power-down applications," 1995 Symposium on VLSI Circuits Digest of Technical Papers, pp. 125-126, Jun. 10-18, 1995.

International Search Report and Written Opinion—PCT/US2011/045222—ISA/EPO—Mar. 12, 2012.

* cited by examiner

US 8,406,064 B2

LATCHING CIRCUIT

I. FIELD

The present disclosure is generally related to a latching circuit.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Such portable computing devices typically include latches that are used to receive and hold data values during operation. Some latches may also include non-volatile storage elements that can be accessed to set an initial state of the latch upon power-up. An improved latching circuit with non-volatile storage elements may enhance operation of computing devices.

III. SUMMARY

A latching circuit includes an isolation element to isolate a pair of cross-coupled inverters from a pair of resistance-based memory elements during a latching operation. The latching circuit may include a pair of magnetic tunnel junction (MTJ) elements that are isolated from a slave latch element via a transmission gate. By isolating the resistance-based memory elements from the latching element, various performance metrics may be improved, such as faster C-Q delay, higher process variation tolerance, no ground boosting induced by leakage current, and no write current degradation. A sensing scheme may include providing feedback paths on a pull-up portion of a sensing circuit and on a pull-down portion of the sensing circuit to lower a sensing current when sensing a state of the resistance-based memory elements.

In a particular embodiment, a non-volatile latch circuit includes a pair of cross-coupled inverters, a pair of resistance-based memory elements, and write circuitry configured to write data to the pair of resistance-based memory elements. The pair of resistance-based memory elements is isolated from the pair of cross-coupled inverters during a latching operation.

In another particular embodiment, a sensing circuit includes a first current path that includes a first resistance-based memory element and an output of the sensing circuit. The sensing circuit includes a second current path to reduce current flow through the first resistance-based memory element at a first operating point of the sensing circuit. The sensing circuit also includes a first n-type metal-oxide-semiconductor (NMOS) transistor to provide a step down supply voltage to the first current path.

In another particular embodiment, a method includes initiating a first write operation to a pair of resistance-based memory elements at a write circuit. The method includes isolating the pair of resistance-based memory elements from a pair of cross-coupled inverters during a latching operation.

In another particular embodiment, the method includes providing a first current path that includes a first resistance-based memory element and an output of a sensing circuit. The first current path is supplied by a stepped down voltage. The method includes providing a second current path to reduce current flow through the first resistance-based memory element at a first operating point of the sensing circuit.

Particular advantages provided by at least one of the disclosed embodiments of a latching circuit can include achieving one or more of faster delay between a clock input and a data output (C-Q delay), reduced sensing current, increased process variation tolerance, no ground boosting induced by leakage current, and no write current degradation, as compared to a latching circuit that does not isolate resistance-based memory elements from a latching element during a latching operation.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
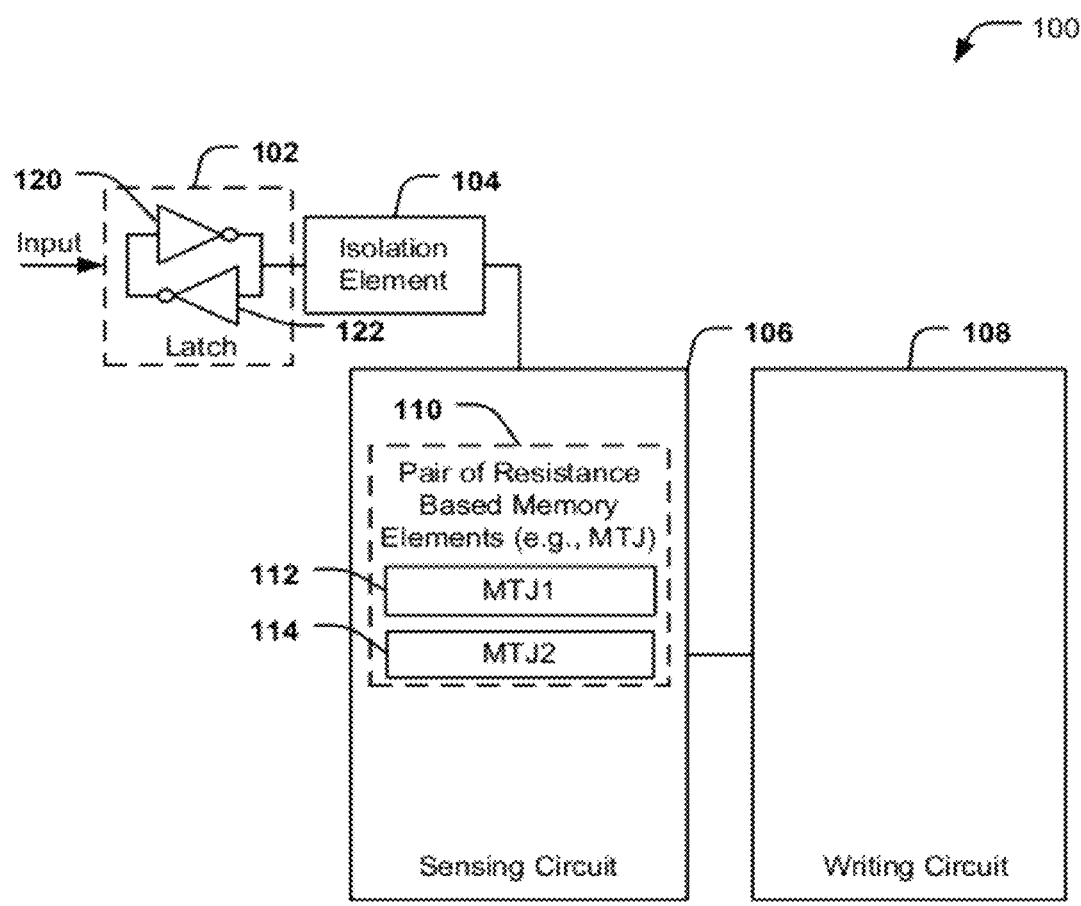
FIG. 1 is a block diagram of a first illustrative embodiment of a latching circuit.

Referring to FIG. 1, a block diagram of a first illustrative embodiment of a non-volatile latching circuit is disclosed and generally designated 100. The latching circuit 100 includes a latch 102 coupled to a sensing circuit 106 via an isolation element 104. The latch 102 includes a pair of cross-coupled inverters 120 and 122. The sensing circuit 106 is coupled to a writing circuit 108. The sensing circuit 106 includes a pair of resistance based memory elements 110. The pair of resistance based memory elements 110 includes a first resistance based memory element 112 (e.g. a first magnetic tunnel junction (MTJ)) 112 and a second resistance based memory element 114 (e.g. a second MTJ).

The latch 102 is configured to receive an input and to hold an output corresponding to the received input. For example, the latch 102 may be implemented as a slave latch of a flip-flop device, as described with respect to FIG. 2. The latch 102 may be coupled to one or more output buffers or to other load elements (not shown).

Figure 2:
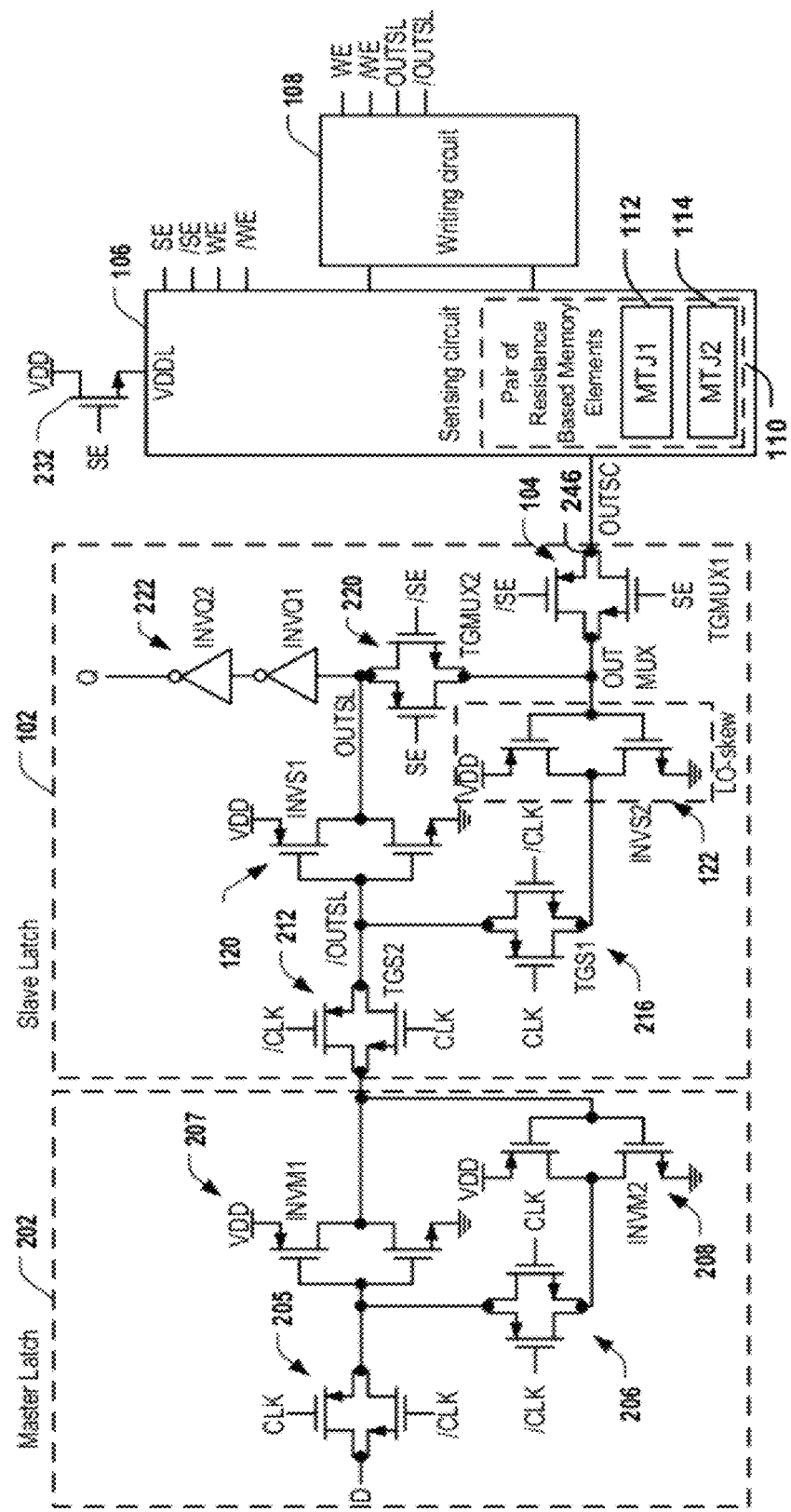
FIG. 2 is a circuit diagram of a particular embodiment of the latching circuit of FIG. 1 in a retention flip-flop configuration.

The isolation element 104 is configured to electrically isolate the latch 102 from the sensing circuit 106 during a latch operation. For example, the isolation element 104 may include a passgate, also referred to as a transmission gate, as illustrated in FIG. 2. The isolation element 104 is configured to prevent a switching current during a latching operation at the latch 102 from disturbing a state of the pair of resistance based memory elements 110.

The sensing circuit 106 is configured to enable the latch 102 to be set to a particular state based on a state of the first and second resistance based memory elements 112, 114. For example, when the circuit 100 experiences a power-up event, the latch 102 may power up to an undetermined state. The sensing circuit 106 may be electrically coupled to the latch 102 during a power-up sequence so that an output of the sensing circuit 106 sets a state of the latch 102 to a known value, as described with respect to FIG. 3. After setting the state of the latch 102, the pair of resistance-based memory elements 110 may be isolated from the pair of cross-coupled inverters 120 and 122 during a latching operation via the isolation element 104.

The writing circuit 108 includes write circuitry configured to write data to the pair of resistance-based memory elements 110. For example, the writing circuit 108 may be configured to receive a data input and to selectively write a first value to the first resistance-based memory element 112 and a second value to the second resistance-based memory element 114. An example of the writing circuit 108 is described with respect to FIG. 6.

In operation, the latch circuit 100 may be powered up from a power-off or low-voltage state. The isolation element 104 may be controlled to couple an output of the sensing circuit 106 to an input of the second inverter 122. As a result, the latch 102 may be set to an initial state that is determined by values stored at the pair of resistance based memory elements 110. For example, the latch 102 may control a driver circuit of a bus and the initial state of the latch 102 may be set to prevent conflicts with other driver circuits of the bus during start-up.

After setting the latch 102 to the initial state, the isolation element 104 may be controlled to isolate (i.e., electrically decouple) the pair of resistance based memory elements 110 from the latch 102. After the latch 102 is isolated from the pair of resistance based memory elements 110, the latching operation may be performed to store input data at the latch 102.

By isolating the pair of resistance based memory elements 110 from the latch 102 during a latching operation, a C-Q delay of the latch 102 may be reduced as compared to a design where the resistance based memory elements 112, 114 are included with the cross-coupled inverters 120, 122 during a latching operation.

Referring to FIG. 2, the latch circuit 100 of FIG. 1 is depicted in a retention flip-flop configuration 200. The retention flip-flop configuration 200 includes the latch 102 configured to operate as a slave latch and coupled to receive input data from a master latch 202. The latch 102 is coupled to the sensing circuit 106 via the isolation element 104, illustrated as a passgate (i.e. a first multiplexer transmission gate) TGMUX1 104. The sensing circuit 106 is coupled to the writing circuit 108.

The master latch 202 includes a passgate 205 coupled between a data input (D) and an input of a first inverter of the master circuit (INVM1) 207. The passgate 205 is configured to provide the data input to INVM1 207 when a clock signal (CLK) has a high value and to isolate INVM1 207 from the data input when CLK has a low value. An output of INVM1 207 is coupled to an input of a second inverter of the master circuit (INVM2) 208. A passgate 206 is configured to isolate an output of INVM2 208 from an input of INVM1 207 when CLK has a high value to reduce contention with the data input D and to couple the output of INVM2 208 to the input of INVM1 207 when the CLK has a low value to set a stable state of the master latch 202.

The slave latch 102 includes a passgate 212 coupled to the first inverter of the slave latch (INVS1) 120 to electrically isolate an output of the master latch 202 from an input to INVS1 when CLK is low (i.e. has a logical low value) and to electrically couple the output of the master latch 202 to the input of INVS1 when CLK is high (i.e. has a logical high value). An input of the second inverter of the slave latch (INVS2) 122 is selectively coupled to an output of the sensing circuit 106 (OUTSC) via the passgate that operates as a first multiplexer transmission gate (TGMUX1) 104. The input of INVS2 122 is also selectively coupled to the output of INVS1 via a passgate that operates as a second multiplexer transmission gate (TGMUX2) 220. TGMUX1 104 and TGMUX2 220 operate as a multiplexer that selects a slave latch output OUTSL when a sense enable signal (SE) is low and that selects the sensing circuit 106 output OUTSC when the SE signal is high. A passgate (TGS1) 216 selectively isolates an output of INVS2 122 from an input of INVS1 120 when CLK is high to reduce contention when latching the output of the master latch 202. A data output Q is generated by an output buffer that is formed by a pair of serially coupled inverters INVQ1 and INVQ2 222 and that is responsive to the output of INVS1 120 (OUTSL).

The sensing circuit 106 is coupled to a supply voltage (VDD) via an n-type transistor 232, such as an n-channel metal-oxide-semiconductor (NMOS) transistor. The transistor 232 is gated by the SE signal and provides a step down supply voltage VDDL to the sensing circuit 106. The sensing circuit 106 includes the pair of resistance based memory elements 110 that includes the first resistance based memory element (MTJ1) 112 and the second resistance based memory element (MTJ2) 114.

The latching circuit 200 uses a master-slave configuration of the latches 102 and 202. In FIG. 2, the sensing circuit 106 is separated from the cross coupled inverters INVS1 120 and INVS2 122 to enable the sensing circuit 106 and the latch 102 to be designed to satisfy competing design goals. For example, a large switching current may enable the latch 102 to switch quickly but a current through the sensing circuit 106 may be limited to reduce disturbances to the resistance based memory elements 112 and 114. The resistance based memory elements 112 and 114 may be isolated from the pair of cross-coupled inverters 120, 122 during a latching operation via the isolation element (TGMUX1) 104.

In operation, when the sense enable (SE) signal has a low logic level (SE=0) and a write enable (WE) signal has the low logic level (WE=0), the latching circuit 200 may be in a latch mode. When writing data from the master latch 202 in the latch mode, the slave latch 102 may use TGS1 216 that is inserted between the two cross-coupled inverters INVS1 120 and INVS2 122 to reduce contention between the driving inverter INVM1 207 in the master latch 202 and INVS2 122 in the slave latch 102.

When the sense enable (SE) signal has a high logic level (SE=1) and WE=0, the slave latch 102 latches a state based on an output of the sensing circuit 106 (OUTSC). TGMUX1 provides OUTSC to the input of INVS2 122, and TGMUX2 220 electrically isolates the output of INVS1 120 from the input of INVS2 122 to prevent contention. INVS2 122 may have a transfer characteristic that is skewed to a logical low level, meaning that INVS2 122 may switch states at an input voltage that is lower than VDD. As a result, INVS2 122 may efficiently respond to a level-shifted signal from the sensing circuit 106 (i.e. having VDDL as a logical high voltage rather than VDD). Thus, INVS2 122 may operate as a level converter to achieve full VDD output level from a signal supplied by a VDDL level from the sensing circuit 106.

In FIG. 2, a clock-to-output (C-Q) delay may be determined by the path formed from TGS2 212 to the driving inverter INVQ2 of the pair of inverters 222 in the slave latch 102 (i.e. the path that includes TGS2 212, INVS1 120, INVQ1, and INVQ2). Because this path is separated from the resistance based memory elements 112 and 114 via TGMUX1 104, delay can be reduced without imposing a current limit to prevent invalid writes to the resistance based memory elements 112 and 114. Latching operations can be improved using a relatively larger current than latches that do not isolate the latching inverters from MTJs. Because of this, the circuit illustrated in FIG. 2 may be suitable for use with high performance, system-on-chip (SoC) applications.

Figure 3:
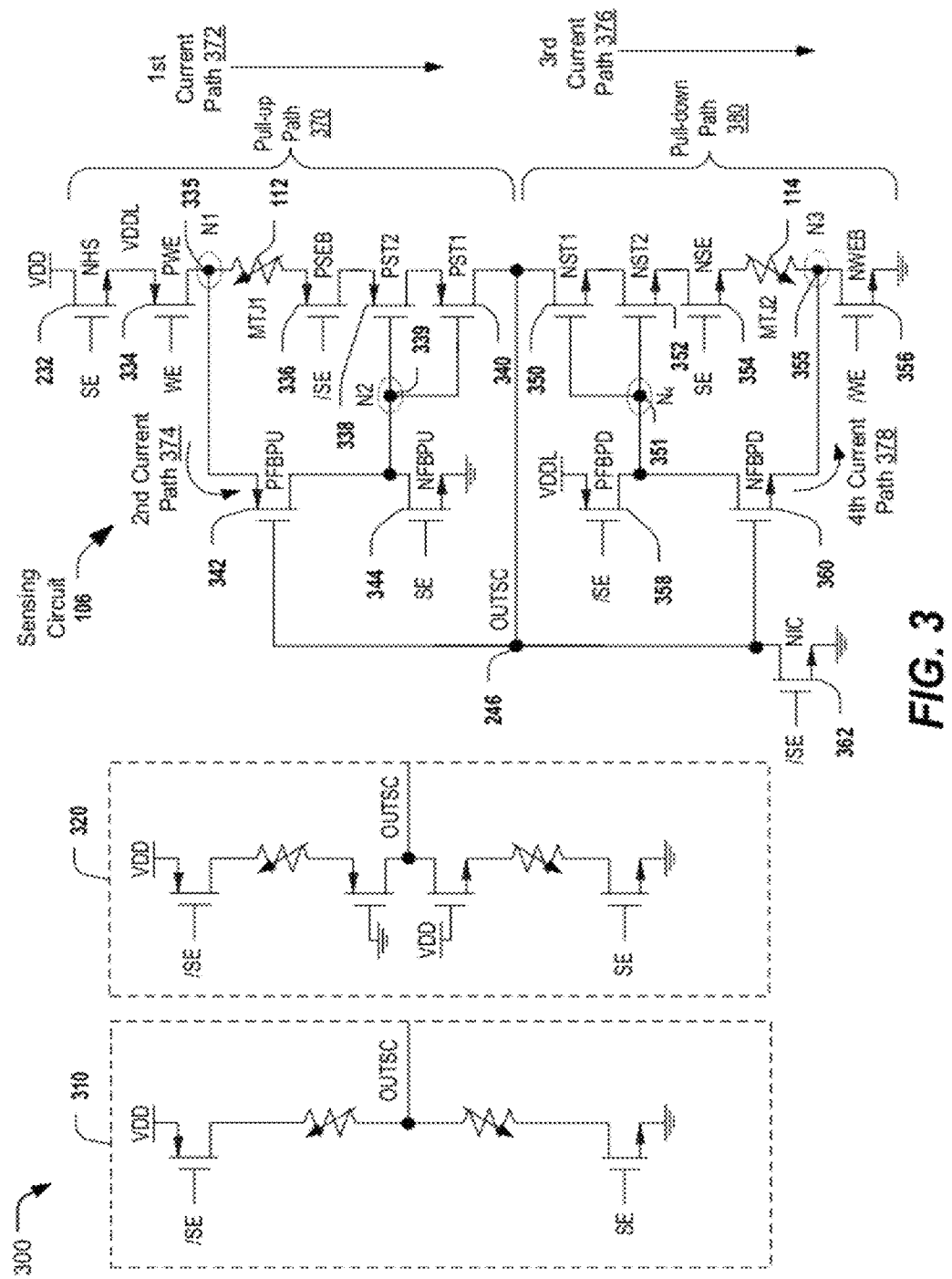
FIG. 3 is a circuit diagram illustrating multiple sensing circuits including a particular embodiment of a sensing circuit that can be used in the latching circuit of FIG. 1.

Referring to FIG. 3, a diagram depicting examples of sensing circuits 310 and 320 and an illustrative embodiment of the sensing circuit 106 of FIG. 1 is disclosed and generally designated 300. In the sensing circuit 106, the n-type transistor (NHS) 232 that provides the step down supply voltage (VDDL) is coupled to a first node (N1) 335 via a p-type transistor (PWE) 334 that is gated by a write enable (WE) signal. The sensing circuit 106 includes a pull-up path 370 configured to selectively bias an output (OUTSC 246) of the sensing circuit 106 at a high voltage level (e.g. VDDL) and a pull-down path 380 configured to selectively bias OUTSC 246 at a low voltage level (e.g. a ground).

A first current path 372 between N1 335 and the output 246 includes the first resistance based memory element 112, illustrated as a first magnetic transistor junction (MTJ1) 112, coupled to three serially coupled p-type transistors: a transistor gated by a complement of the SE signal (PSEB) 336 and two transistors (PST2) 338 and (PST1) 340 that are gated by a voltage at a second node (N2) 339.

A second current path 374 corresponds to a pull-up feedback path that includes a p-type transistor (PFBPU) 342 serially coupled to an n-type transistor (NFBPU) 344 via N2 339. PFBPU 342 has a gate coupled to OUTSC 246, and NFBPU 344 has a gate coupled to the SE signal. The second current path 374 may reduce current flow through the first MTJ1 112 at a first operating point of the sensing circuit 106. For example, when OUTSC 246 has a low voltage, PFBPU 342 is on, increasing a voltage at N2 339 and reducing current through PST2 338 and PST1 340.

A third current path 376 between OUTSC 246 and a third node (N3) includes three serially coupled n-type transistors: two transistors (NST1) 350 and (NST2) 352 that are gated by a voltage at a fourth node (N4) 351 and a transistor gated by the SE signal (NSE) 354. The third current path 376 also includes the second resistance based memory element 114, illustrated as a second magnetic transistor junction (MTJ2) 114. MTJ2 114 is coupled to N3 355. N3 355 is coupled to ground via an n-type transistor (NWEB) 356 that is responsive to a complement of the WE signal.

A fourth current path 378 corresponds to a pull-down feedback path that includes a p-type transistor (PFBPD) 358 serially coupled to an n-type transistor (NFBPD) 360 via N4 351. PFBPD 358 has a gate coupled to a complement of the SE signal (/SE), and NFBPD 360 has a gate coupled to OUTSC 246. The fourth current path 378 may reduce current flow through the second MTJ2 114 at a second operating point of the sensing circuit 106. For example, when OUTSC 246 has a high voltage, NFBPD 360 is on, lowering a voltage at N4 351 and reducing current through NST1 350 and NST2 352.

An n-type transistor (NIC) 362 sets an initial bias condition of OUTSC 246 by coupling OUTSC 246 to ground when a sense operation is not being conducted (/SE=1). When a sense operation is being conducted (SE=1) NIC 362 isolates OUTSC 246 from the ground, enabling OUTSC 246 to be set by the pull-up path 370 and the pull-down path 380. The current paths 372-378 are also isolated from the pair of cross-coupled inverters 120, 122 (shown in FIGS. 1-2) during a latching operation.

Figure 4:
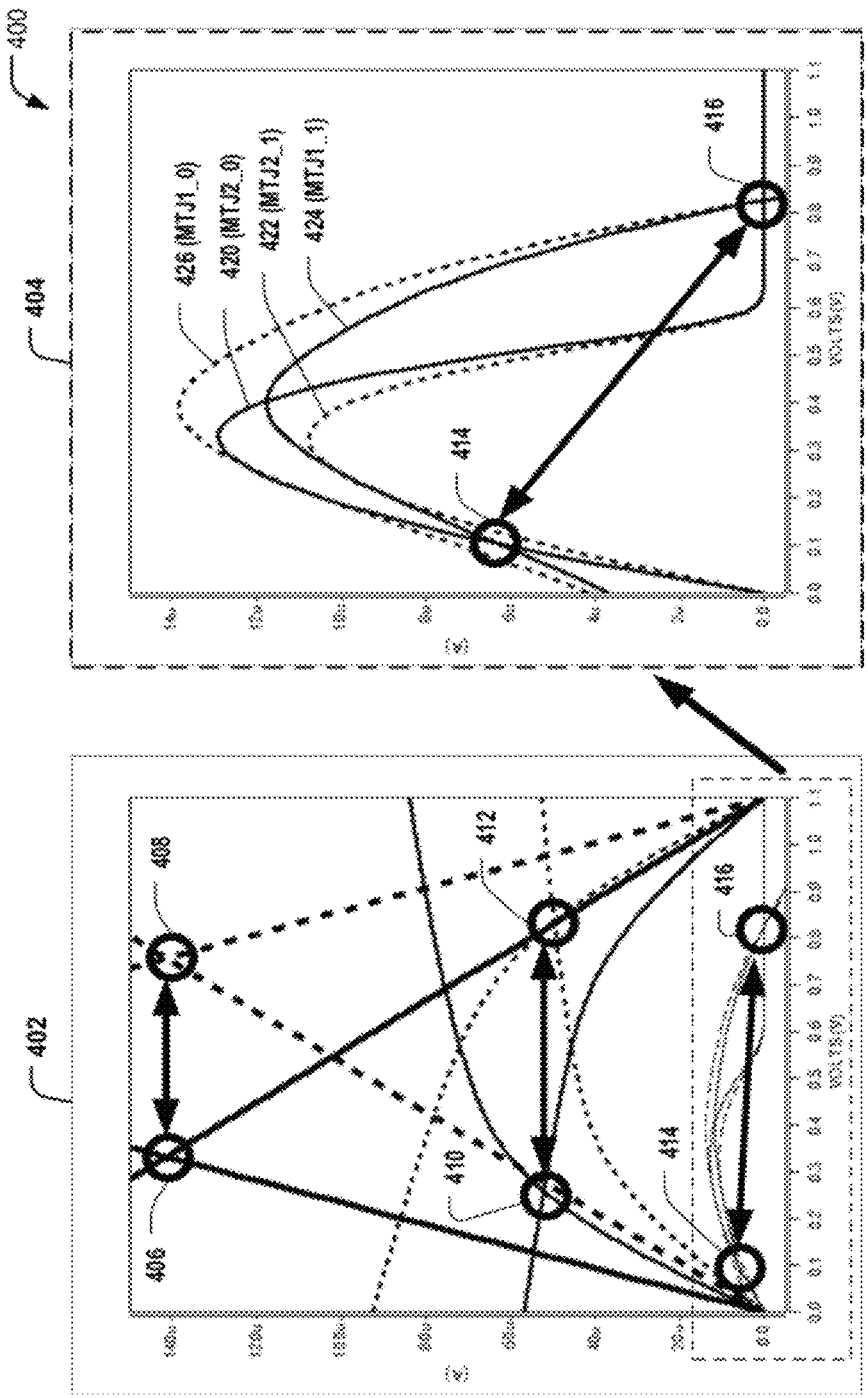
FIG. 4 is a graphical diagram illustrating load lines of the sensing circuits of FIG. 3.

In operation, when SE=1 and WE=0, the latching circuit 100 may be placed in a sensing mode. To find operating points of the sensing circuit 106 for state '0' and state '1' of the MTJs 112 and 114, load line analysis may be used. The I-V characteristics of the first MTJ1 112 with a state '0' (MTJ1_0), the first MTJ1 112 with a state '1' (MTJ1_1), the second MTJ2 114 with a state '0' (MTJ2_0), and the second MTJ2 114 with a state '1' (MTJ2_1) may be obtained by measuring currents through MTJ1_0, MTJ1_1, MTJ2_0, and MTJ2_1 (IMTJ1_0, IMTJ1_1, IMTJ2_0, and IMTJ2_01, respectively) according to a voltage at the output 246, VOUTSC. Operating points for state '0' and state '1' of the sensing circuit 106 may be determined by superimposing IV curves of MTJ1_0 and MTJ2_1 for the pull-up path 370 on I-V curves of MTJ2_0 and MTJ1_1 for the pull-down path 380, as illustrated in FIG. 4.

The sensing circuit 310 includes a voltage divider structure to sense an intermediate node voltage of two serially connected MTJs. The sensing circuit 320 adds a p-channel metal oxide semiconductor (PMOS) transistor and an n-channel metal oxide semiconductor (NMOS) transistor between two MTJs to extend the effective resistance difference between the two MTJs. The sensing circuit 320 may exhibit more sensing margin and less sensing current than the sensing circuit 310. To obtain small sensing current and large sensing margin, the added PMOS may be operated in saturation (or triode) region and the added NMOS may be operated in triode (or saturation) region when a stored value of the MTJs is a state '0' (or a state '1').

In the sensing circuit 106 depicted in FIG. 3, a weak positive feedback using the transistors PFBPU 342 and NFBPU 344 for the pull-up path 370 and a strong positive feedback using the transistors PFBPD 358 and NFBPD 360 for the pull-down path 380 may result in low sensing current and large sensing margin. Because the pull-down path 380 may use smaller NMOS transistors NST1 350, NST2 352, and NSE 354, as compared to PMOS transistors, the pull-down path 380 may be more vulnerable to process variation than the pull-up path 370. The process variation may become worse as drain to source voltage (Vds) is increased. For this reason, transistors NST1 350 and NST2 352 may be turned off at a high Vds (i.e. high VOUTSC) by using the strong feedback for the pull-down path 380. This enables stable level converting at the slave latch 102.

In addition, the low-VDD (VDDL) step down voltage may be used to reduce sensing current. VDDL may be generated by the headswitch NMOS transistor (NHS) 232 between a VDD power rail and the sensing circuit 106. Additionally, further sensing current reduction may be achieved by using additional transistor stacking, such as PST1 340 and PST2 338 for the pull-up path 370 and NST1 350 and NST2 352 for the pull-down path 380.

Because the MTJs 112 and 114 have non-volatile properties, zero standby leakage current can be achieved using the MTJ-based latching circuits, such as the latching circuit 100. A latching circuit without the isolation element 104 of FIGS. 1-2 may have difficulty simultaneously achieving a short C-Q delay, a low sensing current, and a high process variation tolerance. In addition, the latching circuit without the isolation element 104 may have problems, such as leakage induced ground (GND) boosting and a high invalid write probability. The latching circuit 100 with the isolation element 104 may achieve lower C-Q delay and may remove leakage induced GND boosting by separating the MTJs 112 and 114 from the slave latch 102. The latching circuit with the isolation element may also achieve low sensing current and high process variation tolerance by using positive feedback, lower VDD, and transistor stacking. Compared to a latching circuit without the isolation element 104, the latching circuit 100 with the isolation element 104 may have lower C-Q delay and less sensing current.

FIG. 4 is a graphical diagram illustrating a load-line diagram 402 comparing operating conditions of the sensing circuits of FIG. 3. First and second operating points 406 and 408 correspond to the sensing circuit 310 in a state "0" and a state "1", respectively. First and second operating points 410 and 412 correspond to the sensing circuit 320 in a state "0" and a state "1", respectively. First and second operating points 414 and 416 correspond to the sensing circuit 106 in a state "0" and a state "1", respectively.

Aspects of operation of the sensing circuit 106 are shown in further detail in graph 404. In a sensing mode (SE=1), the I-V characteristic of MTJ1_0 426, when VDDL≦VOUTSC≦VDD, when MTJ1 112 is in a "0" state (MTJ1_0), a current through MTJ1_0 (IMTJ1_0) may be 0 because no voltage is applied to MTJ1_0. When a threshold voltage of PFBPU 342 (VTH_PFBPU)<VOUTSC<VDDL, PFBPU 342 is turned-off so no current flows through PFBPU 342. As VOUTSC is decreased, voltage applied to MTJ1_0 is increased and thus IMTJ1_0 is increased. When 0≦VOUTSC≦VTH_PFBPU, PFBPU 342 may be turned-on. As VOUTSC is decreased, the current through PFBPU 342 may be increased because the source to gate voltage of PFBPU 342 (VSG_PFBPU) is increased, and thus a voltage at node N2 339 (VN2) is increased. This lowers the source to gate voltages of PST1 338 and PST2 340 (VSG_PST1 and VSG_PST2). Thus, IMTJ1_0 may be decreased with decreasing VOUTSC. MTJ1 112 in a "1" state (MTJ1_1) may have an I-V characteristic 424 similar to that of MTJ1_0 except that a current though MTJ1_1 (IMTJ1_1) may be smaller than IMTJ1_0 at the same VOUTSC when a resistance of MTJ1_1 (RMTJ1_1) is larger than a resistance of MTJ1_0 (RMTJ1_0).

In the sensing mode (SE=1), MTJ2 in a "0" state (MTJ2_0) and may have an I-V characteristic 420 as follows. When 0≦VOUTSC<threshold voltage of NFBPD 360 (VTH_NFBPD), NFBPD 360 may be turned-off and thus no current may flow through NFBPD 360. As VOUTSC is increased, voltage applied to MTJ2_0 may increase and thus a current through MTJ2_0 (IMTJ1_0) may also increase. When VTH_NFBPD≦VOUTSC<turnoff voltage of NST1 350 (VNOFF), NFBPD 360 may be turned-on. As VOUTSC is increased, the current through NFBPD 360 may be increased because the gate to source voltage of NFBPD 360 (VGS_NFBPD) is increased, and thus a voltage at node N4 351 (VN4) may be decreased. This may lower the gate to source voltages of NST1 350 and NST2 352 (VGS_NST1 and VGS_NST2). Thus, a current though MTH2_0 (IMTJ2_0) may decrease as VOUTSC increases. When VOUTSC reaches VNOFF, VGS_NST1 may become less than the threshold voltage of NST1 350 (VTH_NST1) because the strong feedback may be used for the pull-down path 380. Thus, when VNOFF≦VOUTSC≦VDD, IMTJ2_0 may be 0. MTJ2 114 in a "1" state (MTJ2_1) may have an I-V characteristic 422 that is similar to that of MTJ2_0 except that a current through MTJ2_1 (IMTJ2_1) may be smaller than a current through MTJ2_0 (IMTJ2_0) for approximately the same VOUTSC when a resistance of MTJ2_1 (RMTJ2_1) is larger than a resistance of MTJ2_0 (RMTJ2_0), as shown in FIG. 4.

The operating point of state '0' 414 (state '1' 416) may be the crossing point of I-V curves of MTJ1_1 424 (MTJ1_0 426) and MTJ2_0 420 (MTJ2_1 422) because IMTJ1_0 (IMTJ1_1) may be approximately the same as IMTJ2_1 (IMTJ2_0) at the operating point graph 404 of FIG. 4. Two operating points may exist for state '0' due to a low voltage usage and asymmetric load curves induced by stronger feedback for the pull-down path 380 than the pull-up path 370. However, the two operating points may not be problematic when the operating point for state '0' is correctly determined. A sensing operation may start at VOUTSC=0 Volts (V) since VOUTSC is set to 0V when SE is low by the initial condition setting NMOS transistor (NIC) 362. Thus, the lower voltage operating point of the two operating points 414 and 416 may become the operating point for state '0'.

Figure 5:
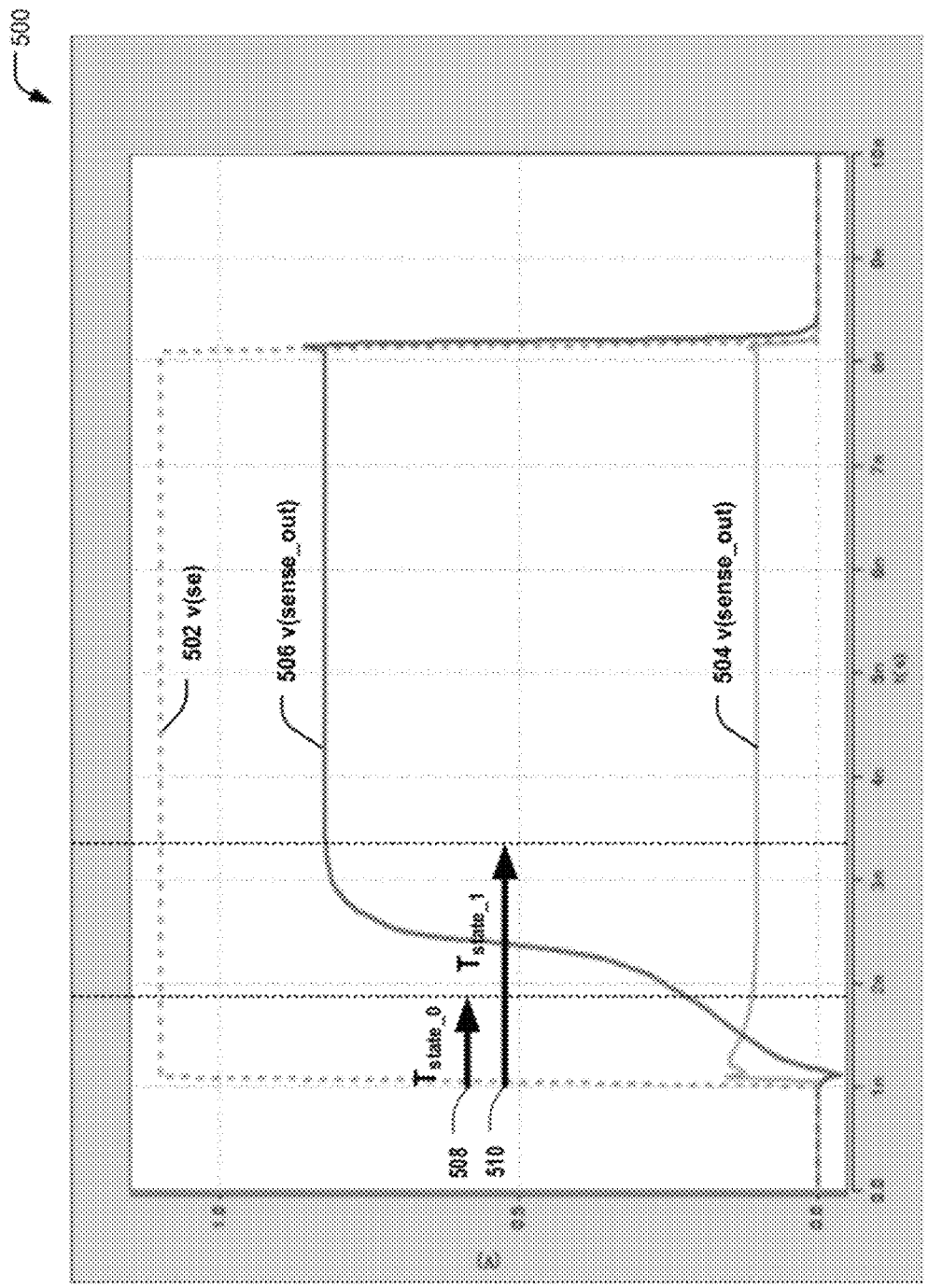
FIG. 5 is a graphical diagram illustrating timing operation of the sensing circuit of FIG. 3 that can be used in the latching circuit of FIG. 1.

FIG. 5 is a timing diagram illustrating a sensing operation at the sensing circuit 106 of FIG. 3. A first signal 502 corresponds to a voltage of the sense enable (SE) signal. A second signal 504 and a third signal 506 correspond to an output voltage (e.g. a voltage at OUTSC 246 (VOUT)) of sensing circuit 106 for a '0' state and for a '1' state, respectively.

When a sensing operation starts at VOUTSC=0V, the sensing speed (illustrated by delay time Tstate_0 508) for state '0' may be very fast. However, when the sensing circuit 106 is in state '1', VOUTSC is increased slowly from 0V as shown in FIG. 5, IMTJ1_0 may remain higher than IMTJ2_1 until VOUTSC reaches VDDL, as shown in graph 404 of FIG. 4. Thus, VN1 may go to VDDL and VN2 may go to 0V when PFBPU 342 is turned off. VN3 and VN4 may go low (near 0V) when NFBPD 360 is turned on. Such node voltages may make pull-up resistance low and may make pull-down resistance high. Therefore, VOUTSC may reach VDDL. Because IMTJ1_0 is significantly reduced by feedback via PFBPU 342 and NFBPU 344 at low VOUTSC, internal nodes of the sensing circuit 106 may be slowly transited until the circuit reaches a steady-state. Thus, a sensing speed for state '1' may be substantially slower than a sensing speed for state '0'. However, the slow sensing speed for state '1' may not be an issue because the sensing speed may be comparatively much faster than a wakeup time.

Even though additional transistors may be used to generate VDDL and to reduce the sensing current, and the VDDL operation may make the sensing circuit vulnerable to process variation, the sensing circuit 106 of FIG. 3 may have a better variation tolerance than conventional sensing circuit designs because the sensing result of the sensing circuit 106 may be determined primarily by the resistance difference between the pull-up path 370 and the pull-down path 380, as opposed to conventional designs that have a sensing result that is affected by both resistance and capacitance in the sensing path.

Low VDD usage in the sensing circuit 106 may require level converting. For example, one of the two cross coupled inverters 120 and 122 which receive VOUTSC may serve as a level converter using a LO-skew design. Even though this may result in DC current, the DC current may have little effect on overall power because the DC current may only occur during a sensing operation.

Figure 6:
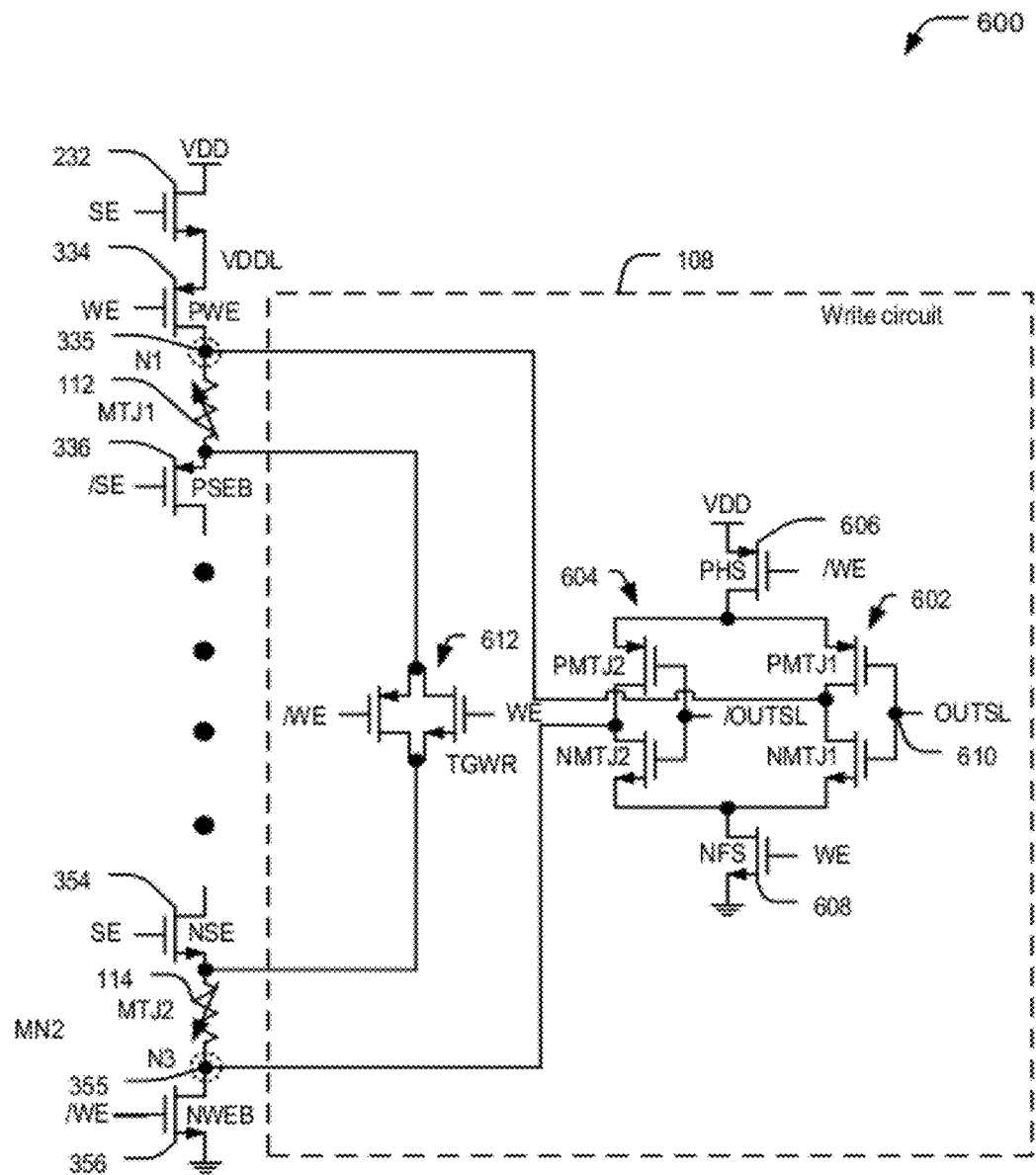
FIG. 6 is a circuit diagram of a particular embodiment of a write circuit that can be used in the latching circuit of FIG. 1.

FIG. 6 is a circuit diagram that depicts a system 600 that illustrates further details of the write circuit 108 of the latch circuit 100 and illustrates other circuit elements from the sensing circuit 106 of FIG. 3. In the system 600, the n-type transistor 232 is coupled to the p-type transistor (PWE) 334. The PWE 334 is coupled to MTJ1 112. MTJ1 112 is coupled to PSEB 336 and to a transmission gate (TGWR) 612 in the write circuit 108. NSE 354 is coupled to TGWR 612 and to MTJ2 114. The second MTJ2 114 is coupled to NWEB 356.

N1 335 is coupled to an output of a first inverter 602 in the write circuit 108. N3 355 is coupled to an output of a second inverter 604. A PMOS transistor headswitch (PHS) 606 is configured to selectively couple the first inverter 602 and the second inverter 604 to a voltage supply. An NMOS footswitch (NFS) 608 is configured to selectively couple the first inverter 602 and the second inverter 604 to ground.

In operation, when the sense enable signal has a logic low value (SE=0) and the write enable signal has a logic high value (WE=1), the system 600 may operate in a write mode. Because a bi-directional current path may be used to write data (state '0' or state '1') to an MTJ, two write drivers may be used. The NFS 608 and the PHS 606 may be used to disconnect a write driver from power rails (VDD and GND) during a latch operation and during a sensing operation. Using two write drivers may generate opposite direction current so the footswitch 608 and the headswitch 606 may be shared.

Because the sensing circuit 106 uses a low voltage supply (e.g., VDDL), sufficient write current may not be attainable by using the sensing path (the serial path of the sensing circuit 106 from NHS 232 through MTJ1 112 and MTJ2 114 to NWEB 356) during a write operation. Thus, a write path using a transmission gate (TGWR) 612 may be inserted between MTJ1 112 and MTJ2 114 to provide a low-resistance write path. Because the write circuit 108 is separate from the latch circuit 102 and from the sensing circuit 106, write current degradation may be reduced.

During a write operation, when the output 610 of the inverter 602 is high (OUTSL=1), a first write driver (PMTJ1 and NMTJ1) connected to MTJ1 112 may become a current sink while the other write driver (PMTJ2 and NMTJ2) may become a current source. A resistance of MTJ1 112 (RMTJ1) may be changed to a low resistance while a resistance of MTJ2 114 (RMTJ2) may be changed to a high resistance to write a state '1' to the sensing circuit 106.

Leakage reduction may also be employed in the write circuit 108. Because the write circuit 108 may be based on a stacked structure, significant leakage current may be suppressed.

Figure 7:
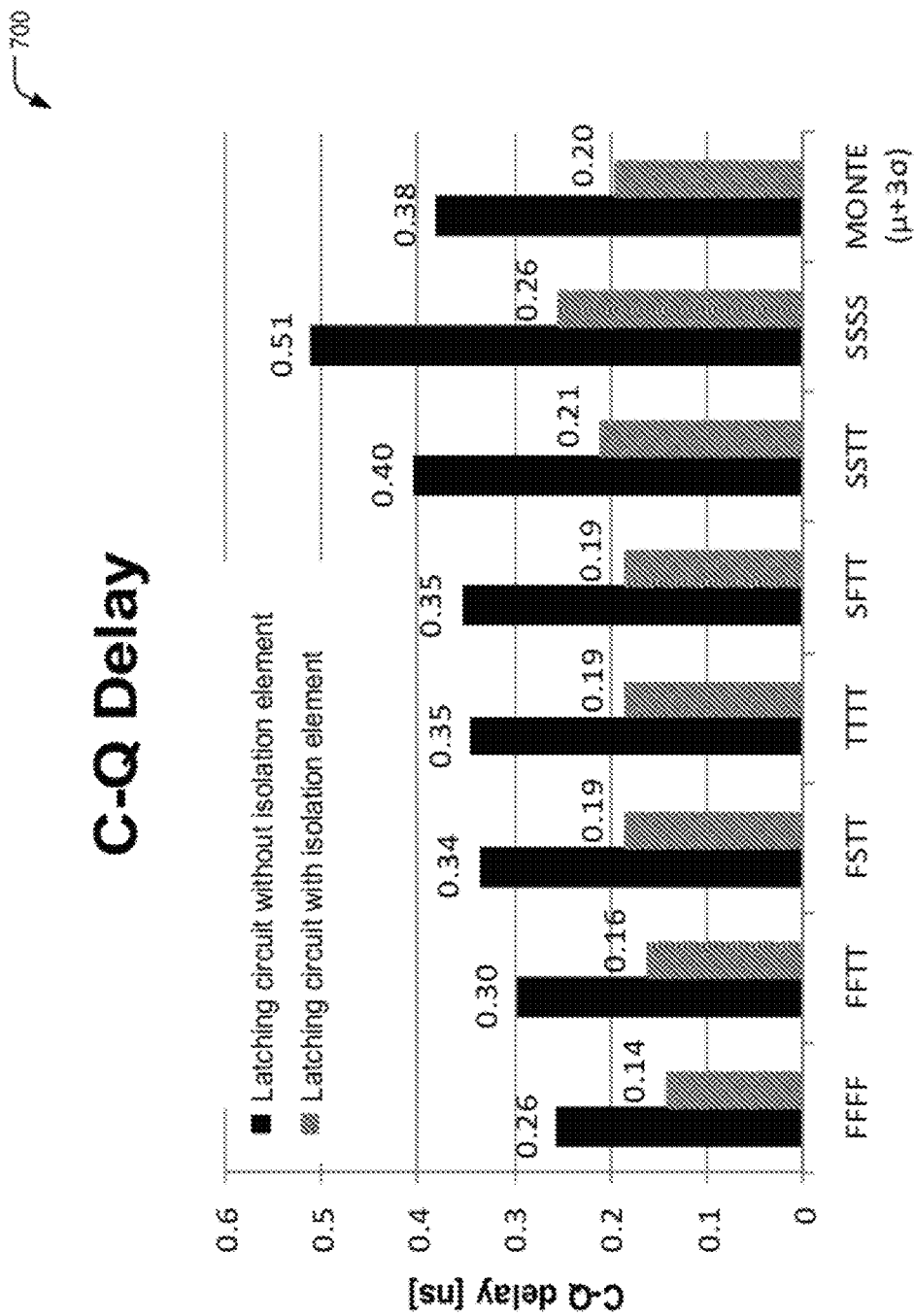
FIG. 7 is a graphical diagram illustrating a clock transition-data output (C-Q) delay of the latching circuit of FIG. 1 at multiple process conditions.

FIG. 7 is a graphical diagram illustrating performance metrics of a latching system that is generally designated as 700. The diagram 700 illustrates the C-Q delay in a latching circuit without an isolation element and in a latching circuit with an isolation element (e.g., the latching circuit of FIGS. 1-3 and 6) using 45 nanometer (nm) process technology and with VDD nominally at 1.1V. The C-Q delay may be measured from a positive edge of a clock signal (CLK) to the negative edge of an output signal (Q) with a fan-out of four (FO 4) load. Monte-Carlo simulation shows that the C-Q delay (mean+ 3sigma) in a latching circuit with an isolation element may be 47.4% less than a latching circuit without the isolation element. This result may be due, at least in part, to isolating the MTJs 112 and 114 from the latch circuit 102.

Figure 8:
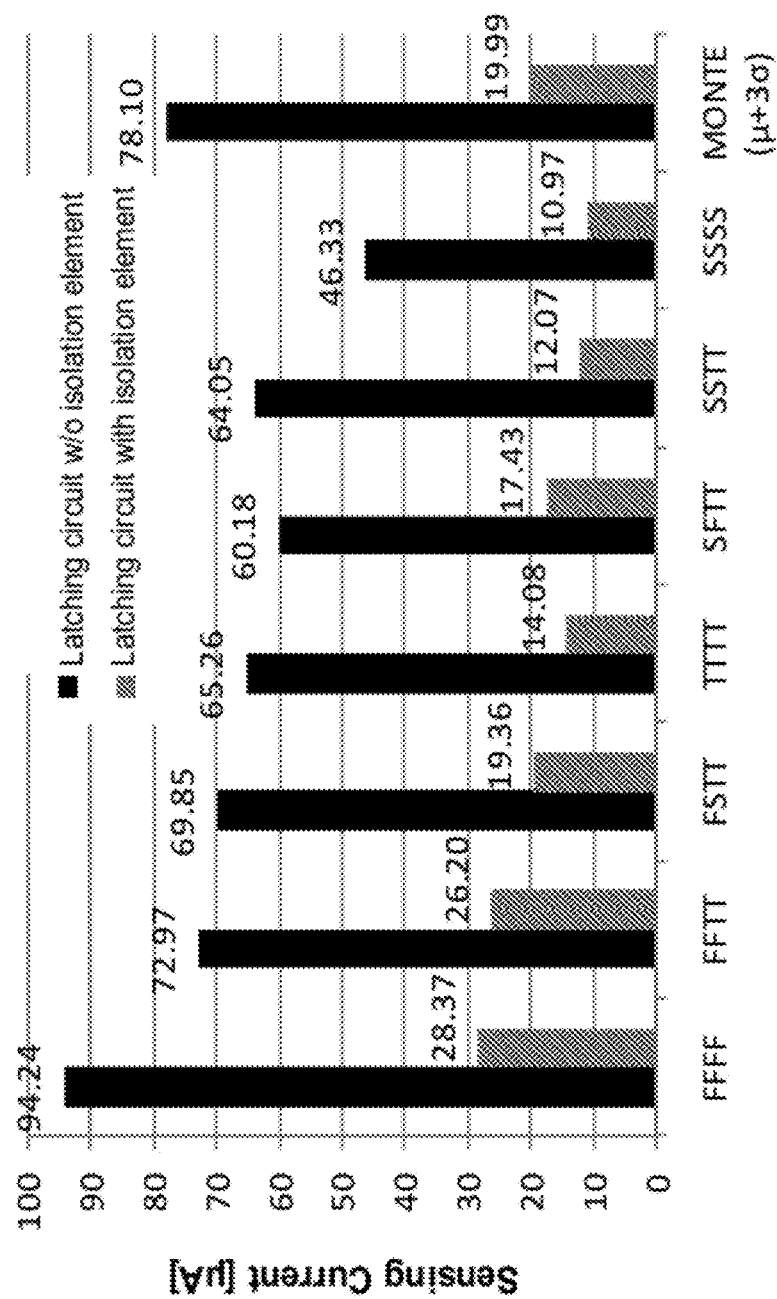
FIG. 8 is a graphical diagram illustrating sensing current of the latching circuit of FIG. 1 at multiple process conditions.

FIG. 8 is a graphical diagram that illustrates the sensing current in a latching circuit without an isolation element and in a latching circuit with an isolation element (e.g., the latching circuit of FIGS. 1-3 and 6). A steady-state sensing current may be estimated using a load curve, such as illustrated in FIG. 4. A short peak current may occur in a transient response due to a rush current right after a sense enable (SE) signal is enabled, a coupling effect between the SE signal and a floating node, and a transition current according to a feedback effect. The peak current may be defined as the sensing current that is illustrated in FIG. 8. The latching circuit with the isolation element shows a reduction of 74.4% of the sensing current (mean+3sigma) in Monte-Carlo simulation due to positive feedback, low-VDD (VDDL) operation, and stacked structure as compared to a latching circuit without the isolation element.

Figure 9:
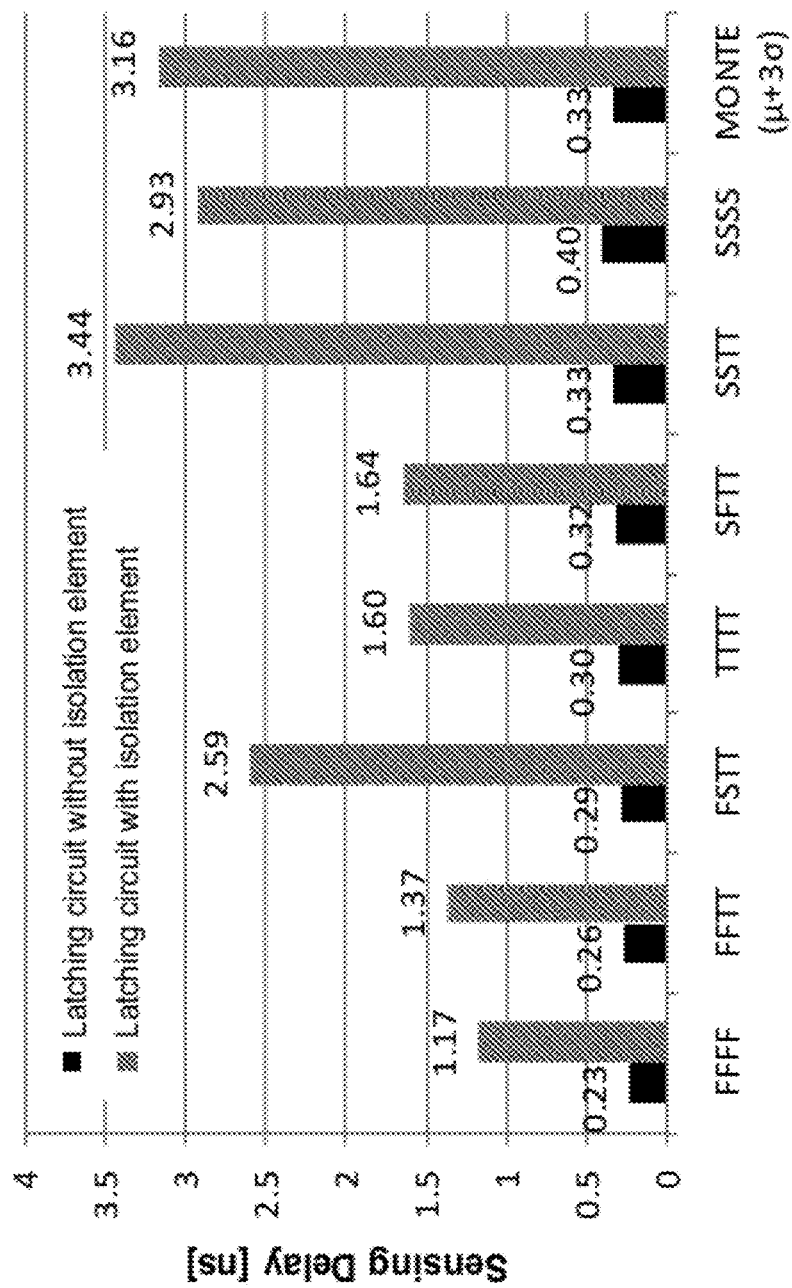
FIG. 9 is a graphical diagram illustrating sensing delay of the latching circuit of FIG. 1 at multiple process conditions.

FIG. 9 is a graphical diagram that illustrates the sensing delay in a latching circuit without an isolation element and in a latching circuit with an isolation element (e.g., the latching circuit of FIGS. 1-3 and 6).

Because the sensing delay for state '1' may be much greater than that for state '0', FIG. 9 compares the sensing delay for state '1' between a latching circuit with the isolation element and a latching circuit without the isolation element. The sensing delay of the latching circuit with the isolation element is much longer than that of the latching circuit without the isolation element. The main reasons for the longer delay of the latching circuit with the isolation element may be initializing the sensing circuit 106 of FIG. 3 to a "0" initial voltage via the NIC 362 of FIG. 3 and feedback effect, as described with respect to the sensing circuit 106 of FIG. 3.

The wake-up time of a system-on-chip (SoC) upon which the latch circuit 100 is implemented may take from several hundred nanoseconds (ns) to several microseconds (µs) in comparison to the sensing delay which is a few nanoseconds. A longer sensing delay may not be detrimental to design of the SOC because the sensing delay is relatively small compared to the wake-up time of the SoC.

Another potential problem of a longer sensing delay may be related to an invalid write. As the sensing delay is increased, the critical current may decrease. The sensing delay and the critical current may have a logarithm relationship. For example, approximately $10^6$ times the sensing delay may be required to get one-fourth of the critical current. Compared to a latching circuit without an isolation element, the latching circuit with the isolation element may have onefourth of the sensing current but nearly ten times the sensing delay. Thus, a large sensing delay may not cause the invalid write problem. Because the proposed structure has very low invalid write probability due to low current sensing, it can be applicable to perpendicular MTJ (P-MTJ) implementations, which have very good scalability but may be vulnerable to invalid write. The longer sensing delay may also increase energy consumption. However, the latching circuit with the isolation element may perform a sensing operation only during a wake-up. Thus, the portion of the sensing energy used is negligible relative to the overall energy consumption of the latching circuit with the isolation element.

Figure 10:
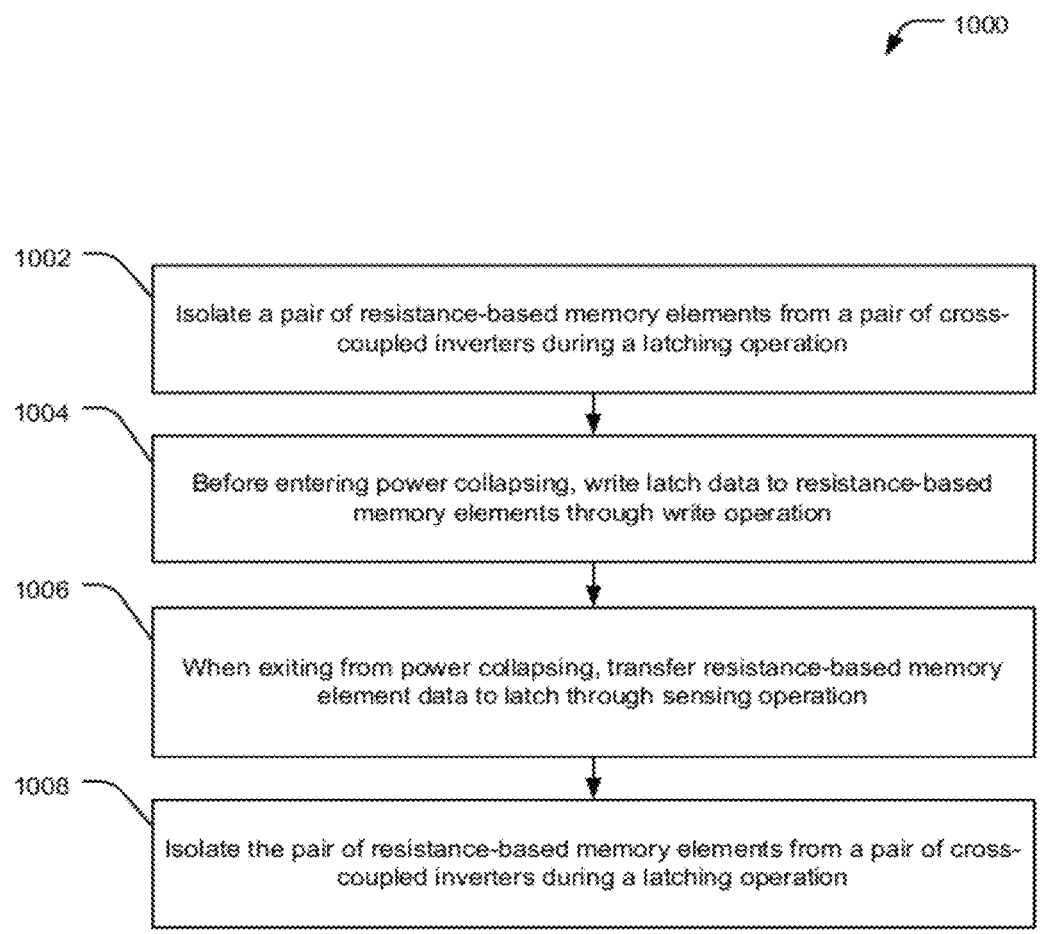
FIG. 10 is a flow diagram of a first illustrative embodiment of a method of operation of a latching system.

Referring to FIG. 10, a first illustrative embodiment of a method of operation of a latching system is depicted and generally designated 1000. The method may be performed by a latching system, such as the latching circuit 100 of FIG. 1.

The method 1000 may include isolating a pair of resistance-based memory elements from a pair of cross-coupled inverters during a latching operation, at 1002. For example, in FIG. 1, the pair of resistance based memory elements 110 may be isolated from the cross-coupled inverters 120 and 122 via the isolation element 104 during a latching operation.

Before entering power collapsing, latch data may be written to resistance-based memory elements through a write operation, at 1004. For example, a first write operation may be initiated to the pair of resistance-based memory elements. The pair of resistance-based memory elements may include a first resistance-based memory element and a second resistance-based memory element. In a particular embodiment, the pair of resistance-based memory elements may be a pair of magnetic tunnel junction (MTJ) memory elements, such as the MTJ memory elements MTJ1 112 and MTJ2 114 of FIG. 3.

Advancing to 1006, when exiting from power collapsing, resistance-based memory element data may be transferred to the latch through a sensing operation. During the sensing operation, a second current path may be provided to reduce to reduce current flow through the first resistance-based memory element along first current path at a first operating point of a sensing circuit. For example, in FIG. 3, the second current path 374 may be provided by activating PFBPU 342 when OUTSC 246 is at a low level to reduce current through the first current path 372 by biasing the gates of PST1 338 and PST2 340 at a high voltage to reduce current flow through MTJ1 112. Current may be provided through a fourth current path to reduce current flow through the first resistance-based memory element along a third current path at a second operating point of the sensing circuit. For example, in FIG. 3, the fourth current path 378 may be provided by activating NFBPD 360 when OUTSC 246 is at a high level to reduce current through the third current path 376 by biasing the gates of NST1 350 and NST2 352 at a low voltage to reduce current flow through MTJ2 114.

Moving to 1008, after transferring the data to the latch via the sensing operation, the pair of resistance-based memory elements may be isolated from the pair of cross-coupled inverters and latching operation may resume.

By isolating a pair of resistance based memory elements from a latch during a latching operation, a current that is used to store data in the latch is isolated from affecting the states of the resistance based memory elements. Data at the latch may be stored at the resistance-based memory elements and recovered by a sensing operation after a power collapse event. Reducing current through the resistance-based memory using feedback paths can prevent disturbing a state of the resistance-based memory devices during the sensing operation.

Figure 11:
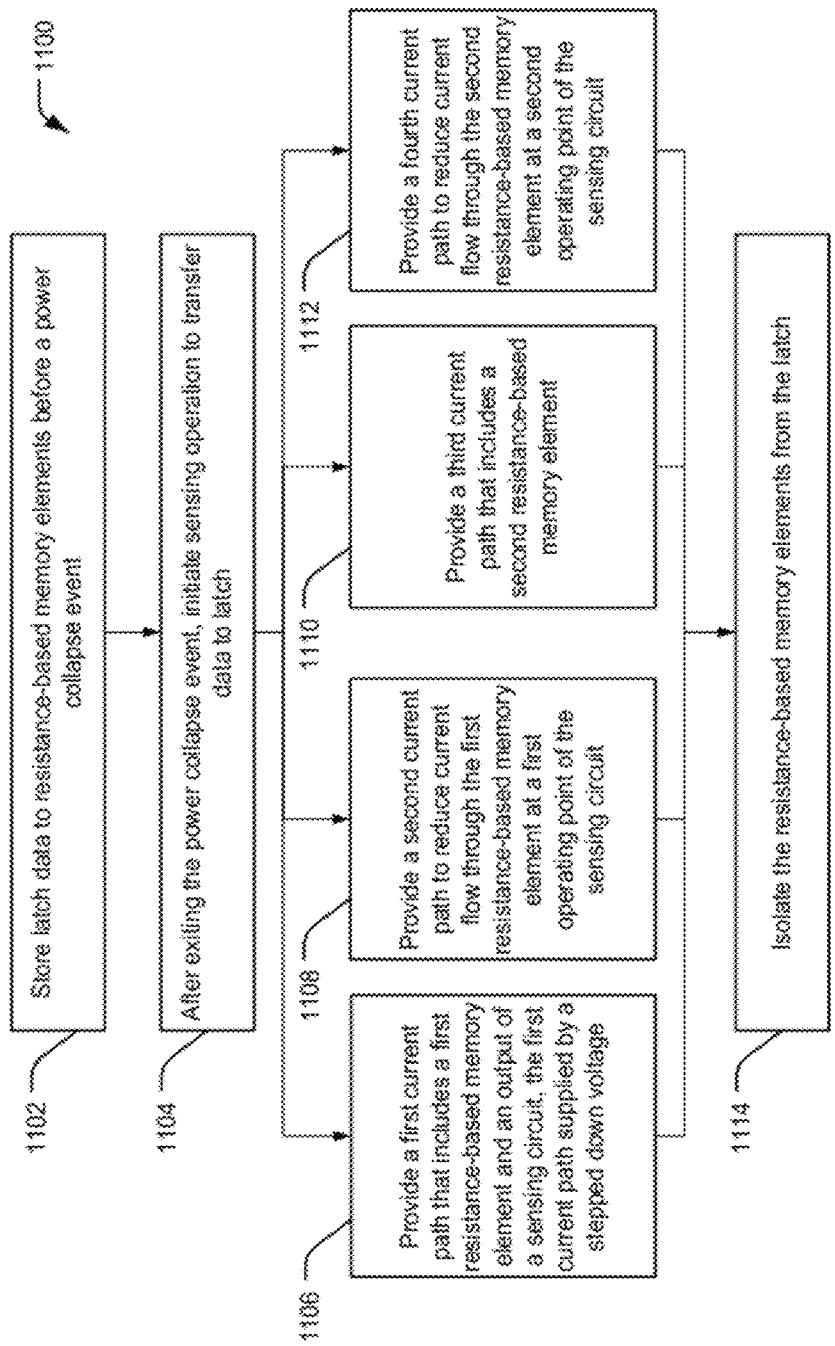
FIG. 11 is a flow diagram of a second illustrative embodiment of a method of operation of a latching system.

Referring to FIG. 11, a second illustrative embodiment of a method of operation of a latching system is depicted and generally designated 1100. The method may be performed by a latching system, such as the latching circuit 100 of FIG. 1 with the write circuit 106 of FIG. 3.

The method 1100 may include storing latch data to resistance-based memory elements before a power collapse event, at 1102. For example, the writing circuit 108 of FIG. 1 may be used to store data of the latch 102 at the pair of resistance-based memory elements 110. After exiting the power collapse event, a sensing operation may be initiated to transfer data to the latch, at 1104. For example, the isolation element 104 may be controlled to couple an output of the sensing circuit 106 to an input of the inverter 122 of the latch 102 and a sense enable (SE) signal may be asserted.

The sensing operation may include providing a first current path that includes a first resistance-based memory element and an output of a sensing circuit, at 1106. The first current path may be supplied by a stepped down voltage. For example, in FIG. 3, the first current path 372 includes MTJ1 112 and OUTSC 246 and is supplied by the step down voltage VDDL supplied by the NHS 232. A second current path can be provided to reduce current flow through the first resistance-based memory element at a first operating point of the sensing circuit, at 1108. For example, in FIG. 3, the second current path 374 may reduce current flow through MTJ1 112 by increasing a voltage at N2 339 when OUTSC 246 has a low voltage. A third current path that includes a second resistance-based memory element can be provided, at 1110. For example, in FIG. 3, the third current path 376 includes MTJ2 114. A fourth current path may be provided to reduce current flow through the second resistance-based memory element at a second operating point of the sensing circuit, at 1112. For example, in FIG. 3, the fourth current path 378 may reduce current flow through MTJ2 114 by decreasing a voltage at N4 351 when OUTSC 246 has a high voltage.

After the sensing operation has provided the data of the resistance-based memory elements to the latch, the resistance-based memory elements may be isolated from the latch, at 1114, and latching operations may be performed. By providing feedback paths to reduce a current through the resistance-based memory elements at operating points of the circuit, an amount of sensing current can be reduced. Reduced sensing current can reduce power consumption and reduce a possibility that the sensing current disturbs a state of the resistance-based memory elements.

Figure 12:
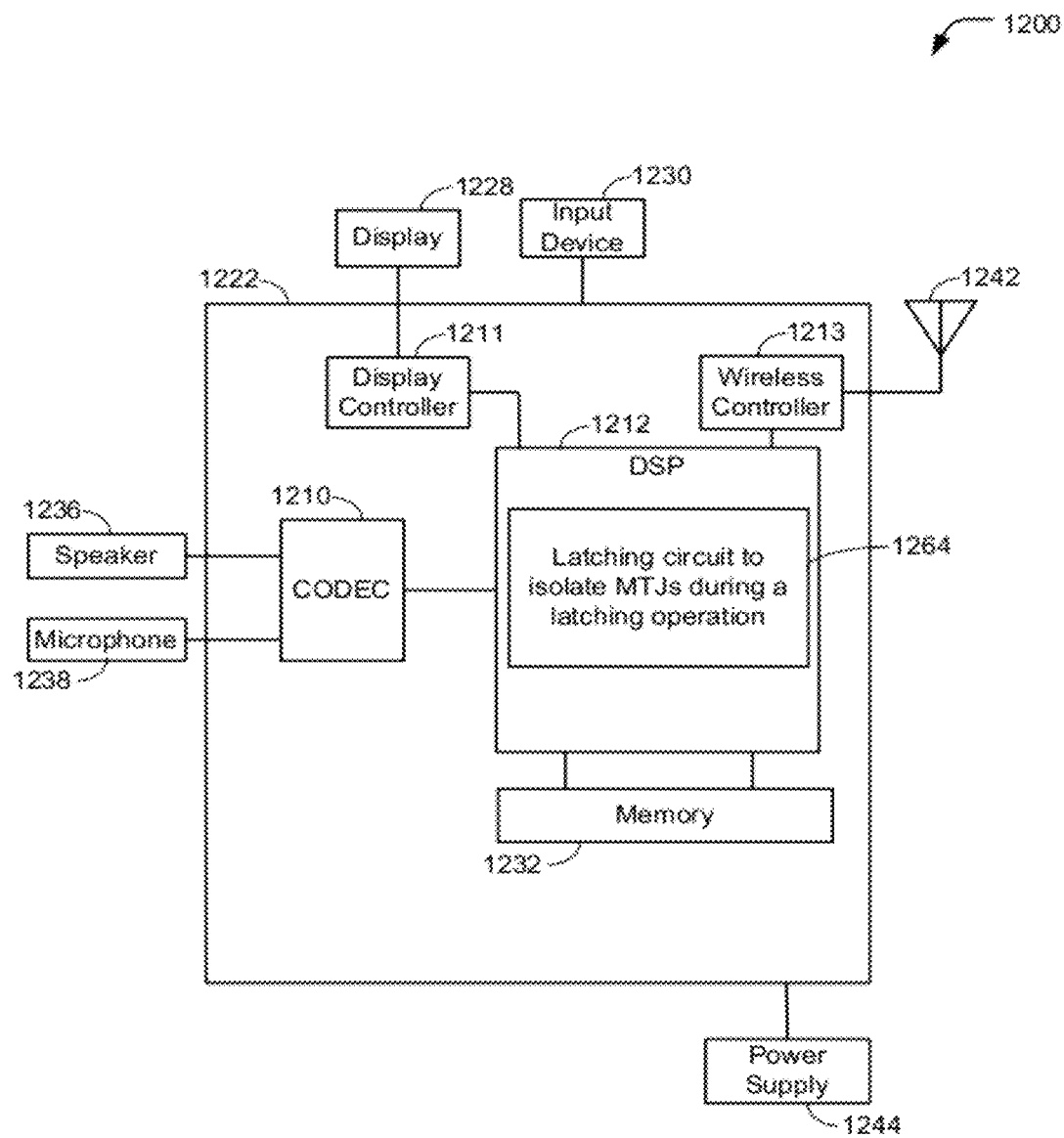
FIG. 12 is an illustrative embodiment of an electronic device that includes a latching circuit to isolate MTJs from a latch element during a latching operation.

Referring to FIG. 12, a block diagram of a particular illustrative embodiment of an electronic device including a latching circuit 1264 configured to isolate MTJs during a latching operation is depicted and designated 1200. The device 1200 may be an electronic device such as a Personal Digital Assistant (PDA), a wireless mobile device, a computing device, other type of device, or any combination thereof. The device 1200 includes a processor 1212 such as a digital signal processor (DSP) that includes the latching circuit 1264 configured to isolate MTJs during a latching operation. For example, the latching circuit 1264 may be the latching circuit 100 of FIG. 1, the retention flip-flop configuration 200 of FIG. 2, the sensing circuit 106 of FIG. 3, the writing circuit 108 of FIG. 6, may operate according to the method of FIG. 11 or FIG. 12, or any combination thereof.

A coder-decoder (CODEC) 1210, a display controller 1211, and a wireless controller 1213 are coupled to the processor 1212. The processor 1212 is also coupled to a memory 1232. For example, the memory 1232 may be a non-transient computer-readable medium storing processor instructions (not shown) that are executable to cause the processor 1212 to perform any of the methods described herein to control operation of the latching circuit 1264.

The display controller 1211 is coupled to a display 1228. A speaker 1236 and a microphone 1238 can be coupled to the CODEC 1210.

The wireless controller 1213 can be coupled to a wireless antenna 1242. In a particular embodiment, the DSP 1212, the display controller 1211, the memory 1232, the CODEC 1210, and the wireless controller 1213 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display 1228, the input device 1230, the speaker 1236, the microphone 1238, the wireless antenna 1242, and the power supply 1244 are external to the system-on-chip device 1222. However, each of the display 1228, the input device 1230, the speaker 1236, the microphone 1238, the wireless antenna 1242, and the power supply 1244 can be coupled to a component of the system-on-chip device 1222, such as an interface or a controller.

Figure 13:
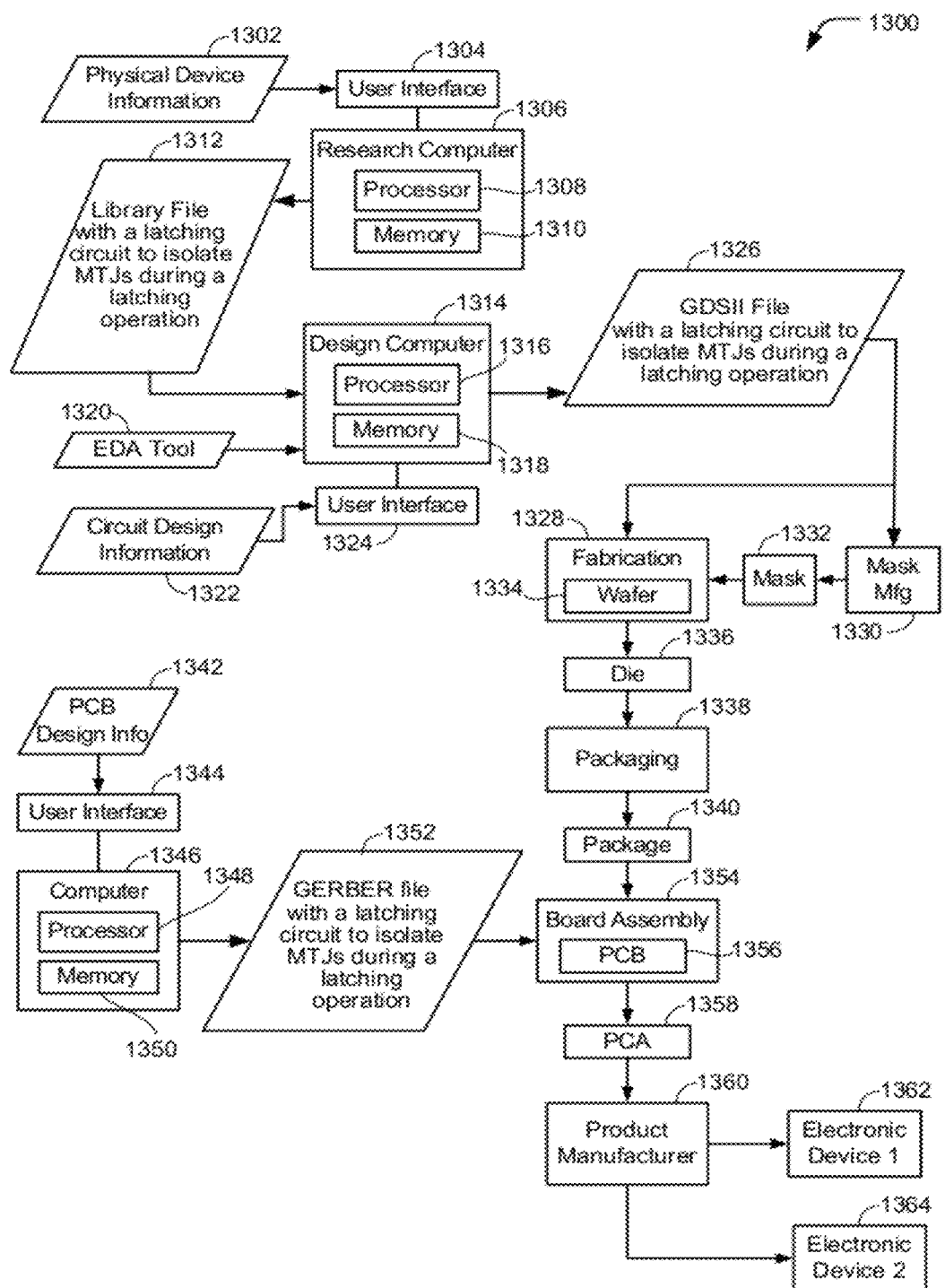
FIG. 13 is an illustrative embodiment of a method of manufacturing an integrated circuit device that includes a latching circuit to isolate MTJs from a latch element during a latching operation.

FIG. 13 is a data flow diagram of a particular illustrative embodiment of a manufacturing process to manufacture electronic devices that include a latching circuit to isolate MTJs during a latching operation.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative embodiment of an electronic device manufacturing process 1300.

Physical device information 1302 is received in the manufacturing process 1300, such as at a research computer 1306. The physical device information 1302 may include design information representing at least one physical property of a semiconductor device, such as the circuit 100 of FIG. 1. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer readable medium such as a memory 1310. The memory 1310 may store computer readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including the circuit 100 of FIG. 1 that is provided for use with an electronic design automation (EDA) tool 1320.

The library file 1312 may be used in conjunction with the EDA tool 1320 at a design computer 1314 including a processor 1317, such as one or more processing cores, coupled to a memory 1318. The EDA tool 1320 may be stored as processor executable instructions at the memory 1318 to enable a user of the design computer 1314 to design a system using the circuit 100 of FIG. 1 of the library file 1312. For example, a user of the design computer 1314 may enter circuit design information 1322 via a user interface 1324 coupled to the design computer 1314. The circuit design information 1322 may include design information representing at least one physical property of a semiconductor device, such as the circuit 100 of FIG. 1. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file formation may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1327 that includes information describing the circuit 100 of FIG. 1 in addition to other circuits or information. To illustrate, the data file may include information corresponding to a system-on-chip (SOC) that includes the circuit 100 of FIG. 1 and that also includes additional electronic circuits and components within the SOC.

The GDSII file 1326 may be received at a fabrication process 1328 to manufacture the circuit 100 of FIG. 1 according to transformed information in the GDSII file 1326. For example, a device manufacture process may include providing the GDSII file 1326 to a mask manufacturer 1330 to create one or more masks, such as masks to be used for photolithography processing, illustrated as a representative mask 1332. The mask 1332 may be used during the fabrication process to generate one or more wafers 1334, which may be tested and separated into dies, such as a representative die 1336. The die 1336 includes the circuit 100 of FIG. 1.

The die 1336 may be provided to a packaging process 1338 where the die 1336 is incorporated into a representative package 1340. For example, the package 1340 may include the single die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1310. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the circuit 100 of FIG. 1.

The computer 1346 may be configured to transform the PCB design information 1342 to generate a data file, such as a GERBER file 1352 with data that includes physical positioning information of a packaged semiconductor device on a circuit board, as well as layout of electrical connections such as traces and vias, where the packaged semiconductor device corresponds to the package 1340 including the circuit 100 of FIG. 1. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines for performing various steps of a PCB production process. The PCB 1356 may be populated with electronic components including the package 1340 to form a represented printed circuit assembly (PCA) 1358.

The PCA 1358 may be received at a product manufacture process 1360 and integrated into one or more electronic devices, such as a first representative electronic device 1362 and a second representative electronic device 1364. As an illustrative, non-limiting example, the first representative electronic device 1362, the second representative electronic device 1364, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1362 and 1364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-3 and may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the circuit 100 of FIG. 1 may be fabricated, processed, and incorporated into an electronic device, as described in the illustrative process 1300. One or more aspects of the embodiments disclosed with respect to FIGS. 1-2 may be included at various processing stages, such as within the library file 1312, the GDSII file 1326, and the GERBER file 1352, as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the mask 1332, the die 1336, the package 1340, the PCA 1358, other products such as prototype circuits or devices (not shown), or any combination thereof. Although various representative stages of production from a physical device design to a final product are depicted, in other embodiments fewer stages may be used or additional stages may be included. Similarly, the process 1300 may be performed by a single entity, or by one or more entities performing various stages of the process 1300.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a non-transitory storage medium such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A sensing circuit comprising:
   a first current path that comprises a first resistance-based memory element and an output of the sensing circuit;
   a second current path to reduce current flow through the first resistance-based memory element at a first operating point of the sensing circuit;
   a third current path that comprises a second resistance-based memory element and the output of the sensing circuit;
   a fourth current path to reduce current flow through the second resistance-based memory element at a second operating point of the sensing circuit; and
   a first n-type metal-oxide-semiconductor (NMOS) transistor to provide a step down supply voltage to the first current path.

2. The sensing circuit of claim 1, wherein the first current path further comprises:
   a plurality of p-type metal-oxide-semiconductor (PMOS) transistors.

3. The sensing circuit of claim 1, wherein the second current path further comprises:
   a p-type metal-oxide-semiconductor (PMOS) transistor; and
   a second NMOS transistor.

4. The sensing circuit of claim 1, wherein the first current path and the second current path are isolated from a pair of cross-coupled inverters during a latching operation.

5. The sensing circuit of claim 4, wherein the first current path and the second current path are isolated from the pair of cross-coupled inverters via a passgate.

6. The sensing circuit of claim 1, wherein the second current path reduces the current flow through the first resistance-based memory element by increasing a voltage applied to a gate of at least one p-type metal-oxide-semiconductor (PMOS) transistor, wherein the at least one PMOS transistor is external to a pair of cross-coupled inverters and serially coupled to the first resistance-based memory element.

7. The sensing circuit of claim 1, wherein the second current path reduces the current flow through the first resistance-based memory element by causing current to bypass the first resistance-based memory element at the first operating point of the sensing circuit.

8. A method comprising:
   providing a first current path that comprises a first resistance-based memory element and an output of a sensing circuit, wherein the first current path is supplied by a stepped down voltage; and
   providing a second current path to cause current to bypass the first resistance-based memory element at a first operating point of the sensing circuit.

9. The method of claim 8, wherein the stepped down voltage is output by a first n-type metal-oxide semiconductor (NMOS) transistor that is coupled to a supply voltage.

10. The method of claim 8, wherein the first current path further comprises a plurality of p-type metal-oxide semiconductor (PMOS) transistors.

11. The method of claim 8, wherein the second current path further comprises:
a PMOS transistor, and
a second NMOS transistor.

12. The method of claim 8, further comprising providing a third current path that includes a second resistance-based memory element.

13. The method of claim 12, further comprising providing a fourth current path to cause current to bypass the second resistance-based memory element at a second operating point of the sensing circuit.

14. The method of claim 8, wherein the second current path causes the current to bypass the first resistance-based memory element by increasing a voltage applied to a gate of at least one p-type metal-oxide-semiconductor (PMOS) transistor, wherein the at least one PMOS transistor is external to a pair of cross-coupled inverters and serially coupled to the first resistance-based memory element.

15. A sensing circuit comprising:
a first current path that comprises a first resistance-based memory element and an output of a sensing circuit, wherein the first current path is supplied by a stepped down voltage; and
a second current path to cause current to bypass the first resistance-based memory element at a first operating point of the sensing circuit.

16. The sensing circuit of claim 15, wherein the second current path causes the current to bypass the first resistance-based memory element by increasing a voltage applied to a gate of at least one p-type metal-oxide-semiconductor (PMOS) transistor, wherein the at least one PMOS transistor is serially coupled to the first resistance-based memory element.

17. An apparatus comprising:
means for establishing a current path via a first resistance-based memory element and an output of a sensing circuit, wherein the first current path is supplied by a means for supplying a stepped down voltage; and
means for causing current to bypass the first resistance-based memory element at a first operating point of the sensing circuit.

18. The apparatus of claim 17 wherein the means for establishing the current path includes at least one p-type metal-oxide-semiconductor (PMOS) transistor, and wherein the means for causing the current to bypass the first resistance-based memory element further comprises means for increasing a voltage applied to a gate of the at least one PMOS transistor.

19. A computer-readable storage device comprising instructions that, when executed by a processor, cause the processor to:
provide, to a sensing circuit, an enable signal that is associated with providing a stepped down voltage to the sensing circuit;
wherein the sensing circuit comprises:
a first current path that comprises a first resistance-based memory element and an output, wherein the first current path is supplied by the stepped down voltage; and
a second current path to cause current to bypass the first resistance-based memory element at a first operating point of the sensing circuit.

20. The computer-readable storage device of claim 19, wherein the second current path causes the current to bypass the first resistance-based memory element by increasing a voltage applied to a gate of at least one p-type metal-oxide-semiconductor (PMOS) transistor, wherein the at least one PMOS transistor is external to a pair of cross-coupled inverters.

* * * * *